(12) United States Patent
Huang et al.

(10) Patent No.: US 8,394,573 B2
(45) Date of Patent: Mar. 12, 2013

(54) PHOTORESIST COMPOSITIONS AND METHODS FOR SHRINKING A PHOTORESIST CRITICAL DIMENSION

(75) Inventors: Wu-Song Huang, Brewster, NY (US); Kuang-Jung Chen, Poughkeepsie, NY (US); Wai-Kin Li, Beacon, NY (US); Sen Liu, Highland Park, NJ (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 12/883,442

(22) Filed: Sep. 16, 2010

(65) Prior Publication Data

US 2012/0070787 A1    Mar. 22, 2012

(51) Int. Cl.
G03F 7/00    (2006.01)
G03F 7/004   (2006.01)
G03F 7/40    (2006.01)

(52) U.S. Cl. .............. 430/271.1; 430/270.1; 430/312; 430/330; 430/331; 430/913; 430/927

(58) Field of Classification Search .............. 430/270.1, 430/271.1, 312, 330, 331, 913, 927
See application file for complete search history.

(56) References Cited

U.S. PATENT DOCUMENTS

| | | | |
|---|---|---|---|
| 5,206,117 A | 4/1993 | Labadie et al. | |
| 5,576,143 A | 11/1996 | Aoai et al. | |
| 6,177,360 B1 | 1/2001 | Carter et al. | |
| 6,258,506 B1 | 7/2001 | Harkness et al. | |
| 6,991,893 B2 | 1/2006 | Goodner et al. | |
| 7,482,107 B2 | 1/2009 | Thackeray et al. | |
| 7,714,162 B2* | 5/2010 | Aoki et al. | 560/163 |
| 2004/0180288 A1 | 9/2004 | Adegawa | |
| 2009/0155715 A1* | 6/2009 | Chen et al. | 430/270.1 |
| 2009/0155718 A1 | 6/2009 | Chen et al. | |
| 2010/0028803 A1* | 2/2010 | Sugimoto et al. | 430/270.1 |
| 2010/0068656 A1* | 3/2010 | Yeh et al. | 430/323 |
| 2010/0075238 A1 | 3/2010 | Fonseca et al. | |
| 2010/0297554 A1* | 11/2010 | Watanabe et al. | 430/270.1 |
| 2010/0304295 A1* | 12/2010 | Kinsho et al. | 430/270.1 |
| 2010/0304297 A1* | 12/2010 | Hatakeyama et al. | 430/270.1 |
| 2011/0033799 A1* | 2/2011 | Watanabe et al. | 430/270.1 |
| 2011/0033803 A1* | 2/2011 | Hatakeyama et al. | 430/285.1 |
| 2011/0042653 A1* | 2/2011 | Glodde et al. | 257/40 |
| 2011/0117490 A1* | 5/2011 | Bae et al. | 430/270.1 |

FOREIGN PATENT DOCUMENTS

JP    2004205699 A  *  7/2004

OTHER PUBLICATIONS

Machine translation of JP 2004-205699 (no date).*
Lee, Y. S., et al., "The polymer electrolyte based on polysiloxane containing both alkyl cyanide and oligo ethylene oxide pendants", Electrochimica Acta 50, 2004, pp. 311-316.

* cited by examiner

*Primary Examiner* — Amanda C. Walke
(74) *Attorney, Agent, or Firm* — Scully, Scott, Murphy & Presser, P.C.; Wenjie Li, Esq.

(57) ABSTRACT

A method for reducing a photoresist critical dimension, the method comprising depositing a photoresist film on a substrate, wherein the photoresist film includes a thermal base generator; patterning the photoresist film to form a first patterned film possessing a first critical dimension; depositing a crosslinkable film over the first patterned film; heat-activating the first patterned film, either before or after depositing the crosslinkable film, to release a base in the first patterned film and cause crosslinking in the crosslinkable film in contact with the first patterned film; and developing the crosslinkable film to remove non-crosslinked soluble portions therein to form a second patterned film possessing a reduced critical dimension compared to the first critical dimension.

16 Claims, 1 Drawing Sheet

PHOTORESIST COMPOSITIONS AND METHODS FOR SHRINKING A PHOTORESIST CRITICAL DIMENSION

BACKGROUND

The present application relates to photoresist compositions and methods of using the same.

Optical photolithography is a technique typically employed in the semiconductor industry for patterning one or more material layers. Many resolution enhancement technology (RET) methods have also contributed to the extension of optical photolithography to print very low $k_1$ images. The value of $k_1$ can be found using the optical projection lithography resolution equation $W = k_1 \lambda / NA$, where W is the minimum printable feature size, $\lambda$ is the exposure wavelength (e.g. 193 nm, 157 nm), NA is the numerical aperture of the lithography system and $k_1$ is a lithographic constant of the system. Double exposure (DE) has emerged as a method to reduce $k_1$ in the fabrication of integrated circuit chips. Several double exposure schemes have been developed including double dipole lithography (DDL) and double exposure double etch ($DE^2$). However, DDL can only print images within diffraction limit, while $DE^2$ is a complex and expensive process. Accordingly, there exists a need to overcome the deficiencies and limitations described hereinabove.

SUMMARY

The present application is directed to a method for reducing a photoresist critical dimension. In general terms, the method involves depositing a photoresist film on a substrate, wherein the photoresist film includes a thermal base generator; patterning the photoresist film to form a first patterned film possessing a first critical dimension; depositing a crosslinkable film over the first patterned film; heat-activating the first patterned film, either before or after depositing the crosslinkable film, to release a base in the first patterned film and cause crosslinking in the crosslinkable film in contact with the first patterned film; and developing the crosslinkable film to remove non-crosslinked soluble portions therein to form a second patterned film possessing a reduced critical dimension compared to the first critical dimension. Hence, the process of the present application reduces the critical dimension of the first pattern, and this, in a controlled and adjustable manner.

In particular embodiments, the method involves: depositing a photoresist film on a substrate, wherein the photoresist film includes a polymer, photoreactive component, and thermal base generator that releases a base at or above an activating temperature; patterning the photoresist film to form a first patterned film possessing a first critical dimension; depositing a crosslinkable film over the first patterned film, wherein the crosslinkable film has the characteristic of undergoing a crosslinking reaction in the presence of a base; heat-activating the first patterned film, either before depositing the crosslinkable film or after depositing the crosslinkable film on the first patterned film, at or above the activating temperature, wherein release of a base from the first patterned film causes crosslinkable film in contact with and in proximity to the first patterned film to undergo a crosslinking reaction to form a crosslinked layer on the first patterned film; and developing the crosslinkable film to remove non-crosslinked soluble portions therein to form a second patterned film in which the crosslinked layer coats and preserves the contours of the first patterned film, wherein the second patterned film possesses a critical dimension that is smaller than the first critical dimension.

In further embodiments, the method of the present application also provides for patterning the first (photoresist) film. For example, the method may also include producing the first patterned film by depositing the photoresist film on a substrate, exposing the photoresist film to radiation that activates the photoreactive component to cause a crosslinking reaction in the photoresist film, and developing the photoresist film to form a first patterned film possessing a first critical dimension.

DETAILED DESCRIPTION

Figure 1A:
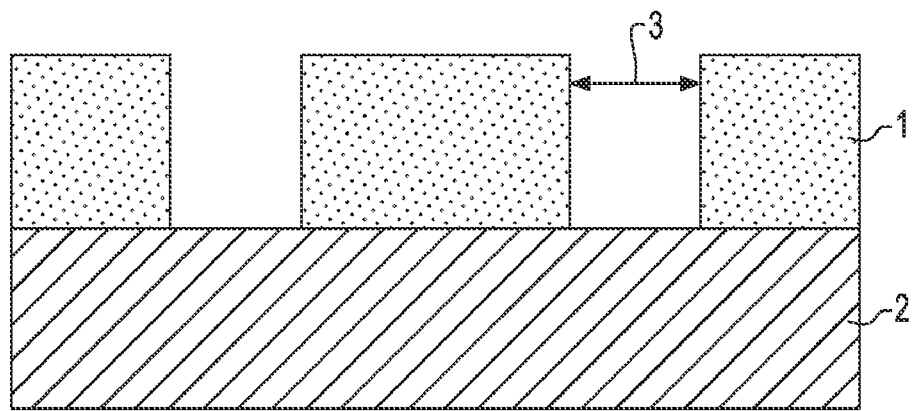
FIGS. 1A-1C provide a pictorial representation (through a cross-sectional view) illustrating an exemplary process described in the present application.

In the method described herein, a photoresist film is first deposited on a substrate. The photoresist film can be deposited by any processes known in the art, such as spin coating, spray coating, dip coating, doctor-blading, roll coating, and the like, which may be used individually or in combination. Typically, after deposition of the photoresist film, the film is post-apply baked at, for example, 90° C., 100° C., 110° C., 120° C., 130° C. or 140° C., for 20, 30, 40, 50, 60, 70, 80, 90, 100, 110 or 120 seconds.

The substrate can be any substrate suitable for integration as a platform in electronic and semiconductor devices. For example, the substrate can be composed of, or include, one or more transition metal elements (for example, Groups IIIB, IVB, VB, IB, and IIB of the Periodic Table), one or more main group elements (for example, Groups IIIA, IVA, and VA of the Si, Ge Periodic Table), or combinations thereof, and particularly, oxides, nitrides, phosphides, arsenides, and/or silicides of these elements. Some particular examples of substrates include silicon, silicon dioxide, germanium, germanium oxide, indium oxide, gallium arsenide, glass, fused silica, mica, ceramics, metals deposited on the aforementioned substrates, and combinations thereof. The substrate can also be a plastic or polymeric material. The substrate may comprise a stack or layering of different materials. For a substrate used in a trilayer approach, there may be a comparatively thick organic underlayer and a thin silicon-containing interlayer, wherein the silicon-containing layer may be, for example, a chemical vapor-deposited silicon oxide layer or a spin-coated silsesquioxane polymer film. In particular embodiments, the substrate is a silicon wafer, such as those employed in semiconductor manufacturing. The films and layers described herein may be disposed on top of the substrate or may be integrally joined or incorporated with the substrate.

The photoresist film of the present application includes at least a polymer component, a photoreactive component, and a thermal base generator component. In some embodiments, the foregoing three components are separate components (i.e., separate compounds or polymers). In other embodiments, at least two of the three components are part of a single component. For example, in some embodiments, the polymer component includes a photoreactive component and/or a thermal base generator component that is integrated into the polymer.

In some embodiments, the polymer of the photoresist film has the property of being substantially soluble in a solvent at or below a first temperature, but becomes substantially insoluble in the same solvent at or above a second temperature higher than the first temperature. In particular embodiments, the first and second temperatures are selected from 90° C., 100° C., 110° C., 120° C., 130° C., 140° C., 150° C., 160° C., 170° C., 180° C., 190° C., 200° C., 210° C., 220° C., 230° C., 240° C., 250° C., 260° C., or greater, or within a range bounded by any two of these temperatures. Generally, the solubility of the polymer determines the solubility of the photoresist (i.e., when the polymer is insoluble, the photoresist is insoluble). The solubility of a polymer in a solvent can be quantified herein by its dissolution rate in the polymer. For example, substantially insoluble polymers or photoresists generally have a dissolution rate of less than about 0.2 nanometers/second (nm/s) in a solvent or aqueous base; moderately soluble polymers or photoresists generally have a dissolution rate of greater than 0.2 nm/s and less than 5 nm/s in a solvent or aqueous base; and substantially soluble polymers or photoresists generally have a dissolution rate of about 5 nm/s or greater in a solvent or aqueous base. Photoacid generators, quenchers, and other additives may also alter the dissolution rates of the photoresist film.

In some embodiments, the polymer of the photoresist is a homopolymer. In other embodiments, the polymer is a copolymer, i.e., a polymer containing two or more different monomer units. Thus, the term "copolymer" used herein also includes terpolymers, tetrapolymers, and pentapolymers. Furthermore, the copolymer can be in any of several structural arrangements, such as a block copolymer, periodic copolymer, alternating copolymer, graft copolymer, or random copolymer. The polymer or copolymer may also be linear or branched. Alternatively, the polymer of the photoresist may be a blend of two or more polymers, such as blends of two or more of the polymers and/or copolymers described above.

In particular embodiments, the polymer of the photoresist film includes monomers containing a lactone group. At least one benefit of including a lactone monomer is that the lactone may improve dissolution in an aqueous developer. Some examples of lactone monomer groups (named as precursor units before polymerization) include: 5-methacryloyloxy-2,6-norbornanecarbo-γ-lactone, 3-methacryloyloxymethyl-2,6-norbornanecarbolactone, 3-acryloyloxymethyl-2,6-norbornanecarbolactone, α-acryloyloxy-γ-butyrolactone, α-methacryloyloxy-γ-butyrolactone, β-acryloyloxy-γ-butyrolactone, and β-methacryloyloxy-γ-butyrolactone.

Some examples of lactone-containing monomer units include:

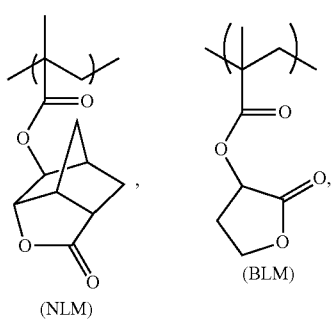

(NLM)     (BLM)

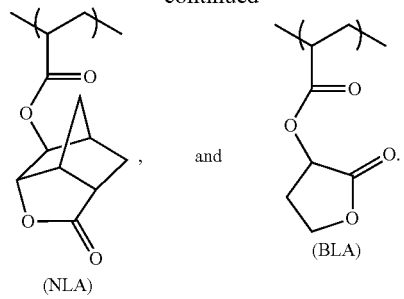

(NLA)     (BLA)

In other embodiments, the polymer includes a monomer containing at least one acid labile moiety. In particular embodiments, the acid labile moiety is a tertiary ester group. The tertiary ester groups are generally those that can be deprotected by an acid generated by the photoacid generator. Some examples of tertiary ester moieties include ester derivatives of structural groups such as: methyladamantane, ethyladamantane, methylcyclopentane, ethylcyclopentane, methylcyclohexane, ethylcyclohexane, methylcycloheptane, ethylcyclohepatane, methylcyclooctane, ethylcyclooctane, and t-butyl. Some examples of such monomer units include:

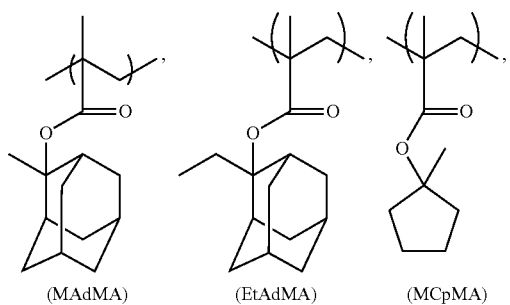

(MAdMA)     (EtAdMA)     (MCpMA)

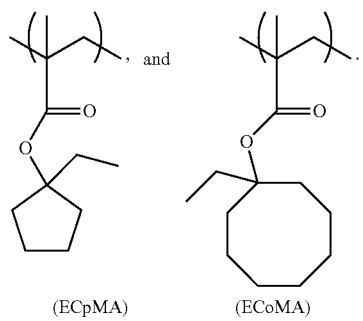

(ECpMA)     (ECoMA)

In other embodiments, the polymer includes a monomer bearing one or more hydrophilic groups, such as one or more hydroxy, carboxylic acid, ether, and/or amido groups. Such hydrophilic monomer units may serve to optimize the solubility behavior of the photoresist in the casting solvent. In particular embodiments, the hydrophilic monomer units make the polymer substantially soluble in the casting solvent at a first temperature and substantially insoluble at another higher temperature, such as a high temperature bake. Some particular examples of such monomer units include:

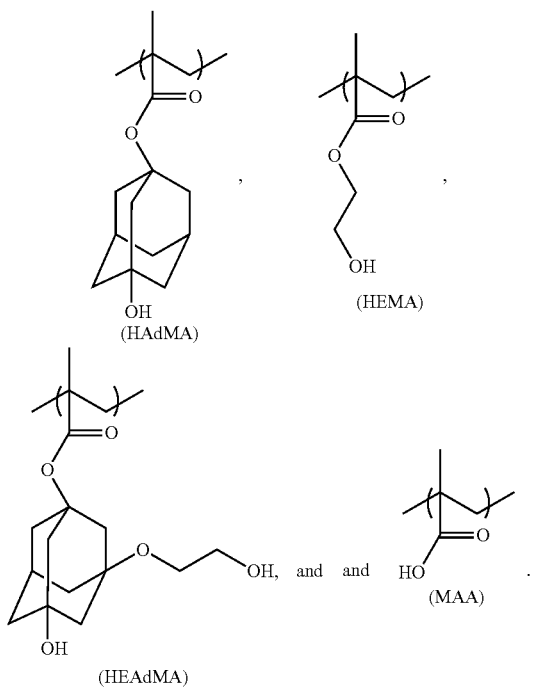

In yet other embodiments, the polymer includes a monomer unit that stabilizes the photoresist image during the developing process. In particular embodiments, these monomer units contain one or more photoresist-stabilizing groups, such as those selected from sulfonamide, fluorinated sulfonamide, fluoroalcohol, dicarboxylmide, N-hydroxydicarboxylmide, phenol, naphthol, amino, and imino groups. A particular example of these types of monomer units includes:

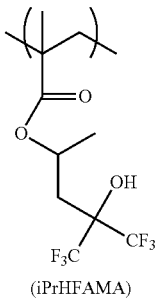

In a first set of embodiments, the polymer is a homopolymer of any of the monomer units described above. In a second set of embodiments, the polymer is a copolymer of any two of the monomer units described above. The copolymer can be represented by the formula $(A)_x(B)_{1-x}$, wherein A and B represent different monomer units of those described above, and x is a number greater than 0 and less than 1, such as 0.05, 0.1, 0.15, 0.2, 0.25, 0.3, 0.35, 0.4, 0.45, 0.5, 0.55, 0.6, 0.65, 0.7, 0.75, 0.8, 0.85, 0.9, or 0.95, or x is within a range bounded by any of the foregoing values. In a third set of embodiments, the polymer is a terpolymer of any of the monomer units described above. The terpolymer can be represented by the formula $(A)_x(B)_y(C)_{1-x-y}$, wherein A, B, and C represent different monomer units of those described above, and x and y are, independently, any of the exemplary numbers recited above for x, or ranges thereof, provided that the sum of x and y is less than 1. In a fourth set of embodiments, the polymer is a tetrapolymer of any of the monomer units described above. The tetrapolymer can be represented by the formula $(A)_x(B)_y(C)_z(D)_{1-x-y-z}$, wherein A, B, C, and D represent different monomer units of those described above, and x, y, and z are, independently, any of the exemplary numbers recited above for x, or ranges thereof, provided that the sum of x, y, and z is less than 1.

In different embodiments, one, two, three, or all of A, B, C, and D monomer units are selected from lactone-containing monomers, thereby resulting in a homopolymer, copolymer, terpolymer, or tetrapolymer that includes lactone-containing monomer units. In other embodiments, one, two, three, or all of A, B, C, and D are selected from tertiary ester monomers, thereby resulting in a homopolymer, copolymer, terpolymer, or tetrapolymer that includes tertiary ester monomer units. In other embodiments, one, two, three, or all of A, B, C, and D are selected from hydrophilic monomers, such as those containing hydroxy and/or carboxy groups, thereby resulting in a homopolymer, copolymer, terpolymer, or tetrapolymer that includes hydrophilic monomer units. In yet other embodiments, one, two, three, or all of A, B, C, and D are selected from monomers containing photoresist-stabilizing groups, thereby resulting in a homopolymer, copolymer, terpolymer, or tetrapolymer that includes photoresist-stabilizing monomer units.

In one set of embodiments, two, three, or all of A, B, C, and D are selected from lactone-containing and tertiary ester monomers, thereby resulting in copolymers, terpolymers, or tetrapolymers that include these types of monomers. In another set of embodiments, two, three, or all of A, B, C, and D are selected from lactone-containing and hydrophilic monomers, thereby resulting in copolymers, terpolymers, or tetrapolymers that include these types of monomers. In another set of embodiments, two, three, or all of A, B, C, and D are selected from lactone-containing and photoresist-stabilizing monomers, thereby resulting in copolymers, terpolymers, or tetrapolymers that include these types of monomers. In another set of embodiments, two, three, or all of A, B, C, and D are selected from tertiary ester and hydrophilic monomers, thereby resulting in copolymers, terpolymers, or tetrapolymers that include these types of monomers. In another set of embodiments, two, three, or all of A, B, C, and D are selected from tertiary ester and photoresist-stabilizing monomers, thereby resulting in copolymers, terpolymers, or tetrapolymers that include these types of monomers. In another set of embodiments, two, three, or all of A, B, C, and D are selected from hydrophilic and photoresist-stabilizing monomers, thereby resulting in copolymers, terpolymers, or tetrapolymers that include these types of monomers.

A particular copolymer composition considered herein is:

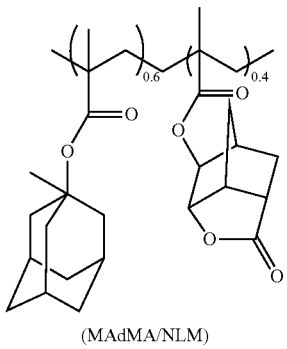

Some particular terpolymer compositions considered herein include:

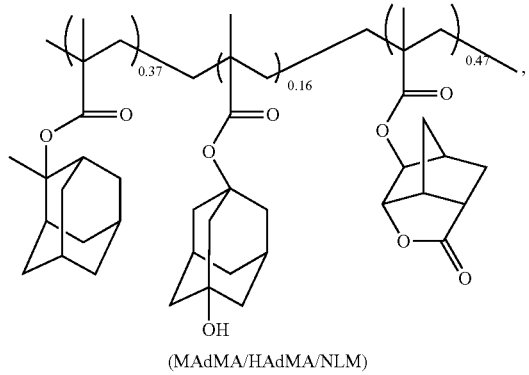

(MAdMA/HAdMA/NLM)

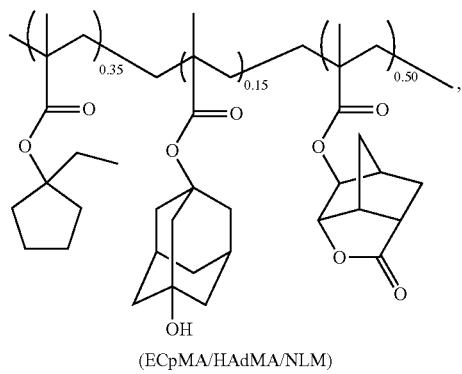

(ECpMA/HAdMA/NLM)

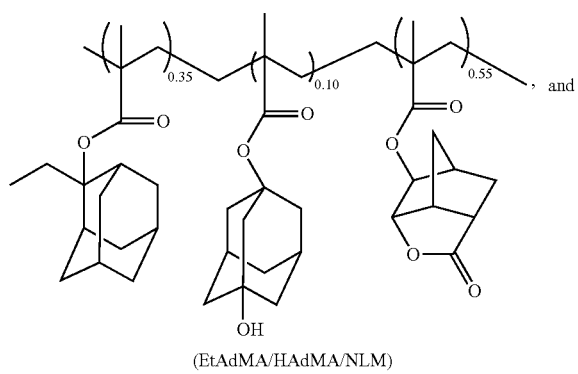
, and (EtAdMA/HAdMA/NLM)

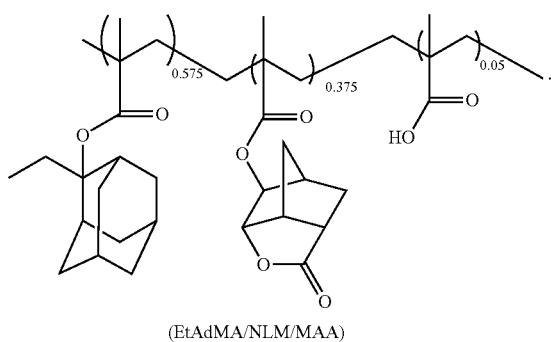

(EtAdMA/NLM/MAA)

A particular tetrapolymer considered herein includes:

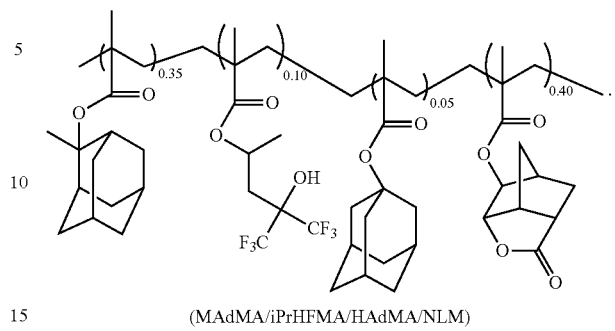

(MAdMA/iPrHFMA/HAdMA/NLM)

In particular embodiments, the polymer includes at least two different tertiary ester monomer units. The difference in deprotection rates of the two ester groups may improve the stability of an image produced from the resist composition. Some examples of polymers containing at least two different tertiary ester moieties include:

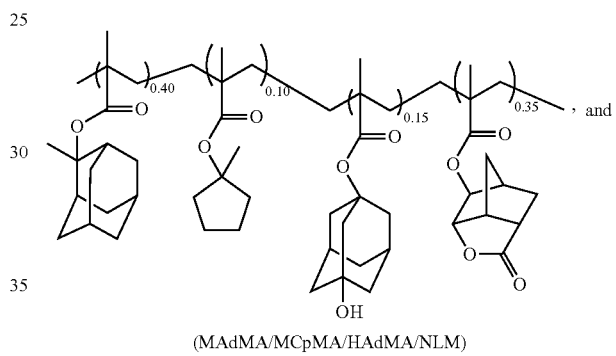
, and (MAdMA/MCpMA/HAdMA/NLM)

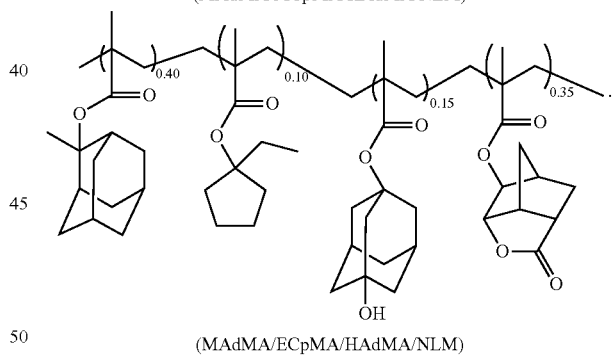

(MAdMA/ECpMA/HAdMA/NLM)

In other embodiments, the photoresist may include a polymer that contains epoxide or urethane moieties for base-catalyzed crosslinking after subjecting the photoresist to a temperature above a first temperature, T, followed by baking to render the photoresist film insoluble to the casting solvent. The photoresist may also include amic ester moieties for base-catalyzed imidization, or pendant carboxyl moieties for base-catalyzed decarboxylation, or carbonyl moieties (aldehyde moieties and ketone moieties), or active methylene moieties for base-catalyzed crosslinking through a Knoevenagel reaction.

The photoresist film also includes a photoreactive component. The photoreactive component is any compound or polymeric appendage, as known in that art, that decomposes upon irradiation to generate a reactive species that renders the photoresist insoluble (i.e., by crosslinking) or soluble in a developing process, depending on whether a negative or positive photoresist composition is used. In some embodiments, the photoreactive component is a photosensitive acid or base generator. In other embodiments, the photoreactive component is transformed, upon irradiation, into a species that alters the solubility of the photoresist in those regions of photoresist that have been irradiated. Some examples of such photoreactive components include diazonaphthoquinone (DNC), epoxy groups, and hydroxystyrene groups.

In particular embodiments, the photoreactive component includes a photosensitive acid generator (PAG). The PAG can be, for example, any of the oxazole, iodonium salt, or disulfonic acid compounds known in the art for this purpose, as comprehensively described in U.S. Pat. No. 5,576,143, the contents of which are incorporated herein by reference in their entirety. Some particular PAGs considered herein include (trifluoro-methylsulfonyloxy)-bicyclo[2.2.1]hept-5-ene-2,3-dicarboximide (MDT), N-hydroxy-naphthalimide (DDSN), onium salts, aromatic diazonium salts, sulfonium salts, diaryliodonium salts, sulfonic acid esters of N-hydroxyamides, imides, and combinations thereof.

The photoresist film further includes one or more thermal base generators. The thermal base generator releases a base at or above an activating temperature. Generally, the activating temperature is at least about 140° C. or greater. In different embodiments, the activating temperature is about or at least 140° C., 150° C., 160° C., 170° C., 180° C., 190° C., 200° C., 210° C., 220° C., 230° C., 240° C., 250° C., 260° C., or greater, or within a range bounded by any two of these temperatures. In various embodiments, the thermal base generator is a compound containing one or more groups selected from amides, sulfonamides, imides, imines, O-acyl oximes, benzoyloxycarbonyl derivatives, quarternary ammonium salts, and nifedipines, examples of which include o-{(β-(dimethylamino)ethyl)aminocarbonyl}benzoic acid, o-{(γ-(dimethylamino)propyl)aminocarbonyl}, benzoic acid, 2,5-bis{(β-(dimethylamino)ethyl)aminocarbonyl}terephthalic acid, 2,5-bis{(γ-(dimethylamino)propyl)aminocarbonyl}terephthalic acid, 2,4-bis {(β-(dimethylamino)ethyl)aminocarbonyl}isophthalic acid, and 2,4-bis{(γ-(dimethylamino)propyl)aminocarbonyl}isophthalic acid.

In particular embodiments, the thermal base generator is a carbamate-containing compound. Of these, preference is given to the fluorenylmethyl carbamates, phenylsulfonylethyl carbamates, and 3-nitropentane-2-yl carbamates. Some examples of carbamate-containing thermal base generators particularly considered herein are those within the following generic structure:

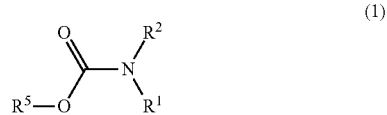

(1)

In formula (1) above, $R^1$ and $R^2$ are independently selected from hydrogen atom and hydrocarbon groups, wherein $R^1$ and $R^2$ are optionally interconnected to form a ring. $R^5$ is a hydrocarbon group the same or different from $R^1$ and/or $R^2$. The hydrocarbon group can be saturated or unsaturated, linear or branched, and cyclic or acyclic. Cyclic hydrocarbon groups also include polycyclic hydrocarbon groups, which can be fused or linked polycyclic hydrocarbon groups. In some embodiments, the hydrocarbon group contains solely carbon and hydrogen atoms. In other embodiments, the hydrocarbon groups can include one or more non-carbon and non-hydrogen atoms (i.e., heteroatoms). Some examples of heteroatoms particularly considered herein include O, N, S, and halogen atoms. In some embodiments, $R^1$ and $R^2$ are both hydrogen atoms. In other embodiments, $R^1$ and $R^2$ are not both hydrogen atoms, e.g., one of $R^1$ and $R^2$ is a hydrogen atom while another of $R^1$ and $R^2$ is a hydrocarbon group. In other embodiments, $R^1$ and $R^2$ are both hydrocarbon groups.

In different embodiments, the hydrocarbon groups considered herein contain one, two, three, four, five, six, seven, eight, nine, ten, eleven, or twelve carbon atoms, or a number of carbon atoms within a range bounded by any two of these carbon numbers, or a number of carbon atoms up to or less than any of these carbon numbers. Some examples of hydrocarbon groups particularly considered herein include methyl, ethyl, n-propyl, isopropyl, n-butyl, isobutyl, sec-butyl, t-butyl, n-pentyl, isopentyl, neopentyl, n-hexyl, 4-methylpentyl, n-heptyl, 5-methylhexyl, n-octyl, 6-methylheptane, n-nonyl, n-decyl, n-undecyl, n-dodecyl, vinyl, allyl, 3-buten-1-yl, 3-buten-3-methyl-1-yl, 4-penten-1-yl, 2,4-pentadien-1-yl, cyclopentyl, cyclohexyl, phenyl, benzyl, tolyl, and xylyl groups. Some examples of halogen-containing hydrocarbon groups include trifluoromethyl, pentafluoroethyl, 2,2,2-trifluoroethyl, fluorophenyl, difluorophenyl, 2-chloroethyl, chlorophenyl, bromophenyl, and iodophenyl groups. Examples of heteroatom-containing hydrocarbon groups can be provided by replacing a hydrogen or halogen atom in any of the foregoing exemplary hydrocarbon and halogen-containing hydrocarbon groups with a heteroatom-containing group (e.g., hydroxy, ether, carboxy, amino, keto, or aldehyde group), or by insertion of an oxygen-containing group (e.g., —O—), nitrogen-containing group (e.g., —NH—), or sulfur-containing group (e.g., —S—) into a carbon-carbon bond.

In particular embodiments, each of $R^1$ and $R^2$ is independently selected from hydrogen atom, linear alkyl, branched alkyl, cycloalkyl, halogenated linear alkyl, halogenated branched alkyl, halogenated cycloalkyl, aryl, and halogenated aryl. For halogenated moieties, the halogen is preferably selected from fluorine, chlorine, and bromine. In specific embodiments, each $R^1$ or $R^2$ is independently selected from fluorinated, chlorinated, or brominated linear alkyl, branched alkyl, cycloalkyl, aryl, and fused polycyclic groups.

In particular embodiments, $R^5$ in formula (1) is or includes a fused polycyclic hydrocarbon group. Some examples of fused polycyclic hydrocarbon groups include naphthyl, methylnaphthyl, anthracenyl, phenanthrenyl, indenyl, fluorenyl, methylfluorenyl, ethylfluorenyl, pyrenyl, and phenalenyl groups. Thermal base generators in which $R^5$ in formula (1) includes a fluorenyl group are particularly preferred because of their lower thermal decomposition temperatures ($T_d$) below 220° C., and preferably below 200° C. The lower $T_d$ results in the generation of more base during a post development bake at a temperature in the range between about 140° C. and about 260° C. The preferred post development bake temperature is between about 150° C. and about 220° C. In different embodiments, the $T_d$ (either a first $T_d$, second $T_d$, or both) of the thermal base generator can be required to be no more than, or below, 240° C., 230° C., 220° C., 210° C., 200° C., 190° C., 180° C., 170° C., 160° C., 150° C., 140° C., 130° C., 120° C., 110° C., or 100° C.

In a particular set of embodiments, the thermal base generator is represented by the following structure (2) wherein $R^5$ in formula (1) is a fluorenyl group:

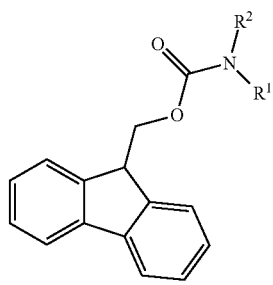

(2)

In formula (2) above, $R^1$ and $R^2$ are as defined above. A specific compound of formula (2) considered herein is shown by the following structure:

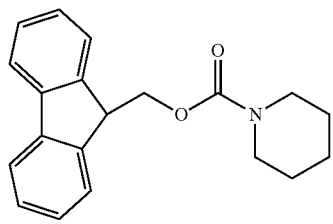

N-9H-fluoren-9-ylmethoxycarbonyl-4-piperidine

The above compound possesses the advantage of a lower decomposition temperature ($T_d$). The compound possesses a first $T_d$ of 105° C. and a second $T_d$ of 160° C.

In other particular embodiments, $R^5$ in formula (1) is a sulfonyl-containing hydrocarbon group. In particular embodiments, the thermal base generator is represented by the following structure (3) wherein $R^5$ in formula (1) is a phenylsulfonyl group:

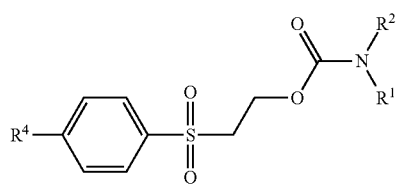

(3)

In formula (3) above, $R^1$ and $R^2$ are as defined above. $R^4$ is defined as a hydrogen atom or any of the hydrocarbon groups described above for $R^1$ and $R^2$.

In other particular embodiments, $R^5$ in formula (1) is a nitro-containing hydrocarbon group. In particular embodiments, the thermal base generator is a carbamate compound wherein $R^5$ in formula (1) is a 3-nitropentyl group, as represented by the following structure:

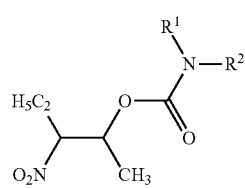

(4)

In formula (4) above, $R^1$ and $R^2$ are as defined above.

In other embodiments, $R^5$ in formula (1) is or includes a methoxyphenyl, dimethoxyphenyl, or trimethoxyphenyl group, particularly when such groups are linked via a tertiary ester linkage to the carbamate oxygen. An example of one such compound is provided by the following structure:

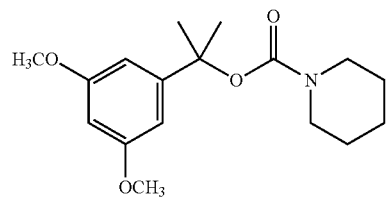 [SMILES: COc1cc(OC)cc(C(C)(C)OC(=O)N2CCCCC2)c1]

N-[[1-(3,5-dimethoxyphenyl)-1-methylethoxy]carbonyl] piperidine, $T_d$ of 193° C.

In other embodiments, the thermal base generator is a dimeric compound having a structure within the following generic structure:

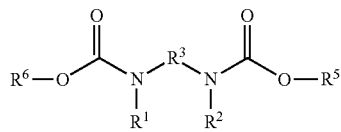

(5)

In formula (5) above, $R^1$ and $R^2$ are independently selected from hydrogen atom and hydrocarbon groups, as defined above. $R^5$ and $R^6$ are, independently, any of the hydrocarbon groups described above for $R^1$ and $R^2$. $R^3$ is a hydrocarbon linker. Some examples of hydrocarbon linker groups are provided by abstracting a hydrogen atom from any of the exemplary hydrocarbon groups described above for $R^1$ and $R^2$. Some particular hydrocarbon linker groups include those according to the formula —$(CH_2)_n$—, wherein n is a number of, for example, 1, 2, 3, 4, 5, 6, 7, 8, 9, 10, 11, or 12, or within a range therein. Furthermore, in embodiments where n is 2 or greater (i.e., for dimethylene and longer linkers), two adjacent hydrogen atoms may be abstracted to provide a carbon-carbon double bond, as found in vinylene (—CH=CH—) or 2-butylene (—$CH_2$—CH=CH—$CH_2$—), or four adjacent hydrogen atoms may be abstracted to provide a carbon-carbon triple bond (e.g., —C≡C— or —$CH_2$—C≡C—$CH_2$—). Other hydrocarbon linker groups are those that include an aliphatic (e.g., saturated) or aromatic ring or fused ring system, such as a cyclopentyl, cyclopentenyl, cyclohexyl, cyclohexenyl, o-, m-, or p-phenylene, vinylphenyl, or divinylphenyl (e.g., —CH=CH-phenyl-CH=CH—) linking or pendant group. In some embodiments, $R^1$, $R^2$, and $R^3$ are not interconnected. In other embodiments, two or all three of $R^1$, $R^2$, and $R^3$ are interconnected. When $R^1$ or $R^2$ is interconnected with $R^3$, then a nitrogen-containing ring is produced. When both of $R^1$ and $R^2$ are interconnected with $R^3$, then two nitrogen-containing rings are produced, as in the structure of DFC shown below.

Some particular examples of dimer forms of thermal base generators include:
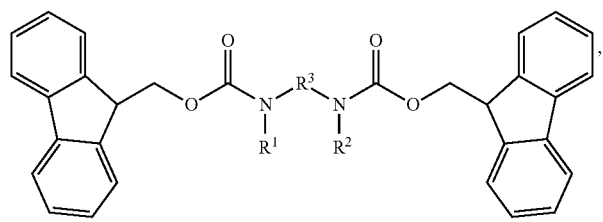
(6)
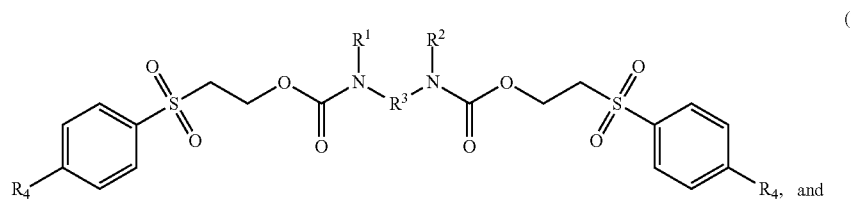
(7)
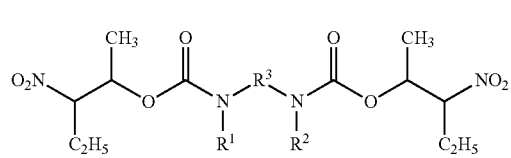
(8)
In formulas (6), (7), and (8), $R^1$, $R^2$, $R^3$, and $R^4$ are as defined above.
Some specific examples of dimeric thermal base generators include:
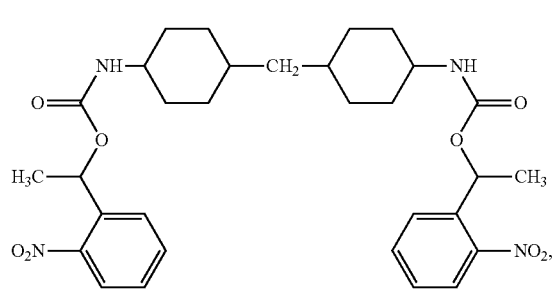
(DNC)
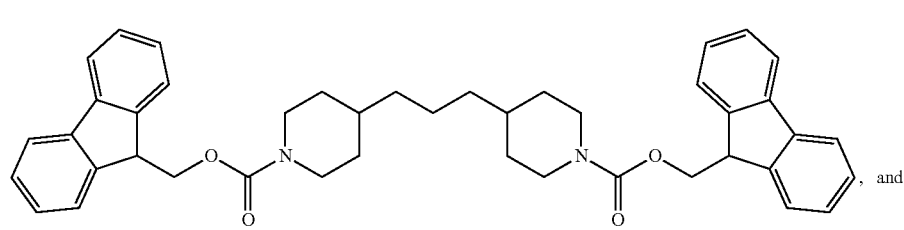
(DFC)
and
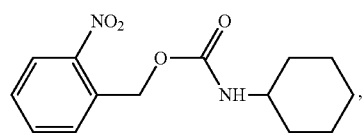
(NBC-101)

-continued

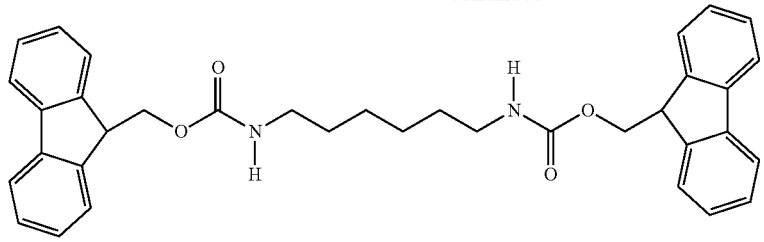

1,6-bis[[9-fluorenylmethoxy]carboylamino]hexane, $T_d$ of 175° C.

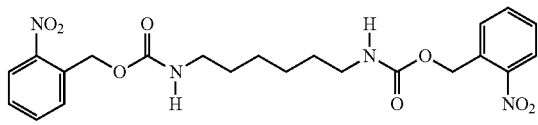 [SMILES: O=C(NCCCCCCNC(=O)OCc1ccccc1[N+](=O)[O-])OCc1ccccc1[N+](=O)[O-]]

1,6-bis[2-nitrobenzyloxy]carboylamino]hexane, $T_d$ of 227° C.

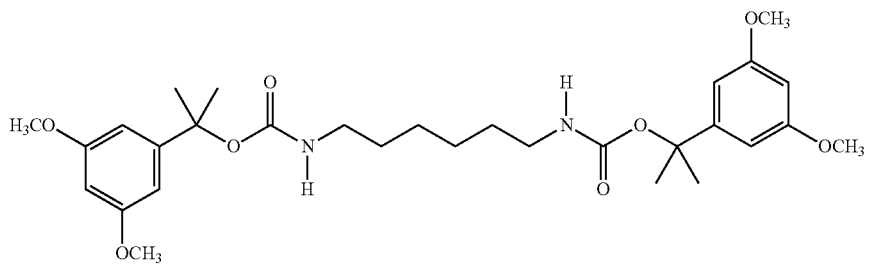 [SMILES: COc1cc(OC)cc(C(C)(C)OC(=O)NCCCCCCNC(=O)OC(C)(C)c2cc(OC)cc(OC)c2)c1]

N,N'-bis[[1-(3,5-dimethoxyphenyl)-1-methylethoxy]carbonyl]hexane-1,6-diamine, $T_d$ of 206° C.

The thermal base generator is preferably not sensitive to the commonly used optical radiation sources, such as 193 nm and 248 nm light sources. The specific thermal base generators described above are generally not sensitive to common optical radiation sources. Therefore, the loading of these base generators in a resist formulation generally would not have a significant effect on the lithographic dose, as long as the baking temperature of the resist is not higher than the thermal decomposition temperature of the thermal base generators.

The photoresist formulation for depositing the photoresist contains each of the components described above along with any additional components that allow or aid in depositing a film of the photoresist on a substrate. For example, the photoresist may include a casting solvent to dissolve the components, so that the photoresist may be applied evenly on the substrate surface to provide a defect-free coating. Where the photoresist is used in a multilayer imaging process, the solvent used in the imaging layer may not be a solvent to the underlayer materials, otherwise unwanted intermixing may occur. Some examples of casting solvents include ethers, glycol ethers, aromatic hydrocarbons, ketones, esters, ethyl lactate, γ-butyrolactone, cyclohexanone, ethoxyethylpropionate (EEP), a combination of EEP and gamma-butyrolactone (GBL), and propylene glycol methyl ether acetate (PGMEA).

The photoresist formulation may further comprise a surfactant. Surfactants may be used to improve coating uniformity, and may include ionic, non-ionic, monomeric, oligomeric, and polymeric species, or combinations thereof. Examples of some surfactants include fluorine-containing surfactants, such as the FLUORAD series available from 3M Company in St. Paul, Minn., and siloxane-containing surfactants such as the SILWET series available from Union Carbide Corporation in Danbury, Conn., USA.

The photoresist can contain any of numerous proportions of the various components. For example, the photoresist may contain a minimum of about 1% by weight (wt %), 2 wt %, or 5 wt %, and a maximum of about 10 wt %, 15 wt %, 20 wt %, 25 wt %, or 30 wt % of polymer based on the total weight of the composition. The photoresist may contain a minimum of about 0.1 wt %, 0.2 wt %, 0.5 wt %, 1 wt %, 2 wt %, or 5 wt %, and a maximum of about 10 wt %, 15 wt %, 20 wt %, 25 wt %, or 30 wt % of thermal base generator based on the weight of the polymer in the composition. The photoresist composition may comprise from about 0.5 wt %, 1 wt %, 2 wt %, or 5 wt %, and a maximum of about 10 wt %, 15 wt %, or 20 wt % of photoreactive component (e.g., photoacid generator) based on the weight of the polymer in the composition. The photoresist precursor solution may contain from about 50 wt %, 60 wt %, or 70 wt % to about 80 wt %, 85 wt %, 90 wt %, 95 wt %, or 99 wt. % solvent based on the total weight of the precursor composition, and more typically from about 85 wt % to about 98 wt % solvent. The photoresist precursor composition may further include about 0.001 wt % to about 0.1 wt % of surfactant based on the total weight of polymer in the composition.

The photoresist film is patterned to form a first patterned film possessing a first critical dimension. The patterning of the photoresist film can be achieved by any of the methods known in the art. In methods generally known in the art, the patterning process first involves exposing the photoresist film to radiation that activates the photoreactive component to cause a difference in solubility, with respect to the developer, between those portions of the photoresist film that have been exposed and those portions that have not been exposed. In particular embodiments, radiative exposure causes a crosslinking reaction to occur in the photoresist film, which causes insolubility of the exposed portions.

In a typical exposure process, a radiation or particle beam source projects radiation or energetic particles through a patterned mask onto the film disposed on the substrate. The mask may have a pattern of masked sections that are essentially opaque to the radiation or impenetrable to the energetic particles, as well as unmasked sections that are essentially transparent to the radiation or penetrable to the energetic particles. Radiation or energetic particles passing through the unmasked sections are transmitted to the film to be absorbed in the exposed regions of the film, wherein the radiation or particles activate a photoreactive component (e.g., photoacid) in the exposed regions of the film. In the event a photoacid is used, unexposed regions of film do not produce an acid. Exposure to the radiation or energetic particles typically render the exposed regions soluble in a developer.

The photoresists of the present application may be patternwise imaged using radiation, such as ultraviolet (UV), deep-ultraviolet (DUV), or extreme-ultraviolet (EUV) radiation. Some particular UV wavelengths that may be employed, include, for example, approximately 436 nanometers (nm) or 365 nm. Some particular DUV wavelengths that may be employed include, for example, approximately 257 nm, 248 nm, 193 nm, and 157 nm. Some particular EUV wavelengths that may be employed include, for example, approximately 4 nm to approximately 70 nm, such as approximately 13 nm, x-ray, or a combination of these. Other wavelengths of radiation may be used, such as 313 nm, 334 nm, 405 nm, or 126 nm, particularly when the radiation source is a mercury emission source or wavelength-specific laser. For high performance lithography, single wavelength and/or narrow band radiation sources may be used. For less stringent conditions, a broad band multiple wavelength source may be used. The photoresist compositions of the present invention may also be pattern-wise imaged using particle beams, such as electron beam, ion beam, combinations of these, and the like. The appropriate radiation or particle beam type(s) often depends to a large extent on the particular components chosen for the photoresist composition.

After exposure, the photoresist film is developed. Typically, before developing the photoresist film, the film is post-exposure baked at, for example, 90° C., 100° C., 110° C., 120° C., 130° C. or 140° C., for 20, 30, 40, 50, 60, 70, 80, 90, 100, 110 or 120 seconds. The developing step is typically achieved by contacting the exposed photoresist to a basic solution, where the base-soluble regions of the film are removed from the film to form a first patterned film. The developer may be organic or aqueous-based. A particular aqueous base developer considered herein is an aqueous solution of tetramethylammonium hydroxide.

After patterning the photoresist film, the patterned photoresist film (i.e., first patterned film) is baked at or above the activating temperature, as described above. Heating the photoresist film above the activating temperature causes the thermal base generator to release a base within the first patterned film including the interior portions and surface of the first patterned film.

In one embodiment, after heat activating the first patterned film, a crosslinkable film is deposited onto the first patterned film. The crosslinkable film possesses the characteristic of undergoing a crosslinking reaction (and thus, curing or hardening) in the presence of a base. Hence, when the crosslinkable film is deposited onto the first patterned film, the regions of the crosslinkable film in contact with or in close proximity to the surface of the first patterned film will cure and bond to the surface of the first patterned film while preserving the features of the first patterned film. Typically, after deposition of the crosslinkable film, and before development, the film is baked at, for example, 100° C., 110° C., 120° C., 130° C., 140° C., 150° C., 160° C., 170° C. or 180° C., for 20, 30, 40, 50, 60, 70, 80, 90, 100, 110 or 120 seconds.

In an alternative embodiment, the crosslinkable film is deposited onto the first patterned film before the first patterned film is heat activated. In this embodiment, the initially coated first patterned film is subjected to a heat activating step to release a base in the first patterned film. The released base will migrate to the surface where it makes contact with the crosslinkable film that has already been deposited.

The crosslinkable film contains therein at least one base-catalyzed crosslinkable material (i.e., a crosslinkable polymer or compound). The crosslinkable material can be any of the crosslinkable materials known in the art having this property. In certain embodiments, a portion (e.g., 5, 10, 20, 30, 40, 50, 60, 70, 80, or 90%) or all of the crosslinkable material can be replaced with one or more non-crosslinkable materials in order to reduce the dissolution rate in aqueous base developer. Examples of these materials are pendant carboxylic moieties for base catalyzed decarboxylation and aldol moieties for base catalyzed dehydration.

In first set of embodiments, the crosslinkable material is a siloxane-containing compound or polymer. If multiple siloxane units are present, the crosslinkable material is herein considered a polysiloxane. The polysiloxane can be a polymer or compound. In a first set of embodiments, the crosslinkable material is a polysiloxane polymer wherein at least a portion of the siloxane units contain at least one silyl-methoxy group, and the polymer also contains at least one silanol group. In a second set of embodiments, the crosslinkable material is a polysiloxane compound. The polysiloxane compound can be, for example, a silsesquioxane, or a linear or branched polysiloxane compound containing two to twenty siloxane units, or a cyclic polysiloxane. Some examples of suitable silsesquioxane compounds include methylsilsesquioxane (MSSQ), also known as octamethylsilsesquioxane, as well as ethylsilsesquioxane, isopropylsilsesquioxane, cyclopropylsilsesquioxane, phenylsilsesquioxane, hydroxyethylsilsesquioxane, hydroxypropylsilsesquioxane, cyanoethylsilsesquioxane, and methoxypropylsilsesquioxane. Some examples of linear polysiloxanes include hexamethyldisiloxane and octamethyltrisiloxane. Some examples of cyclic polysiloxanes include hexamethylcyclotrisiloxane, hexaethylcyclotrisiloxane, and octamethylcyclotetrasiloxane.

In a second set of embodiments, the crosslinkable material is, or includes, a polymer or compound that contains epoxide groups. The epoxide-containing polymer can be, for example, a polysiloxane polymer or compound containing such groups.

In a third set of embodiments, the crosslinkable material is, or includes, a polymer or compound that contains ester groups. Some examples of polymers containing ester groups include any polymers containing one or more ester-containing monomers described above, such as an amic ester group.

In a fourth set of embodiments, the crosslinkable material is, or includes, groups that can react to form imide linkages. The imide-producing groups can include, for example, carboxyl, ester, aldehyde, or ketone groups in combination with amino groups.

In a fifth set of embodiments, the crosslinkable material is, or includes, phenol and formaldehyde groups that react under basic conditions to form a phenol-formaldehyde polymer wherein phenol groups are crosslinked by methylene linkages. In related embodiments, active methylene moieties may be base-catalyzed to crosslink through a Knoevenagel reaction.

In a sixth set of embodiments, the crosslinkable material includes isocyanate groups and isocyanate-reactive groups (e.g., diol, polyol, or amino groups), wherein the groups crosslink with each other under basic conditions.

After the crosslinkable film has reacted with base on the surface of the first patterned film, the crosslinkable film is developed, as described above. The developing process removes non-crosslinked (i.e., soluble) portions of the crosslinkable film, while leaving crosslinked (i.e., insoluble) portions of the crosslinked film on the surface. The crosslinked layer, thus produced, coats and preserves the contours (i.e., features) of the first patterned film. The resulting first patterned film coated with the film of crosslinked and developed material is herein referred to as the second patterned film. As would be appreciated by one skilled in the art, the second patterned film possesses a critical dimension that is smaller than the critical dimension of the first patterned film.

In particular embodiments, the thickness of the crosslinked film determines the reduction in critical dimension, i.e., the thicker the crosslinked film, the more the critical dimension is reduced. Thus, a particular aspect of the instant invention is its ability to adjust or optimize the thickness of the crosslinked film in order to appropriately reduce the critical dimension. The thickness of the crosslinked film can be suitably adjusted by, for example, adjusting the concentration of crosslinkable material in the film, adjusting the precursor film thickness, adjusting the amount and/or reactivity of the thermal base generator in the first patterned film, and/or adjusting the base activation conditions (e.g., temperature and time of activation) to cause more or less amount of base to be produced.

Figure 1B:
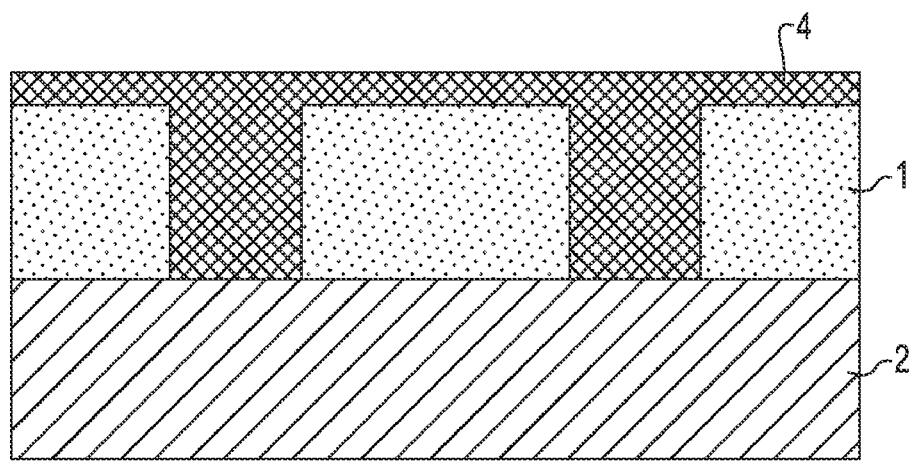
Figure 1C:
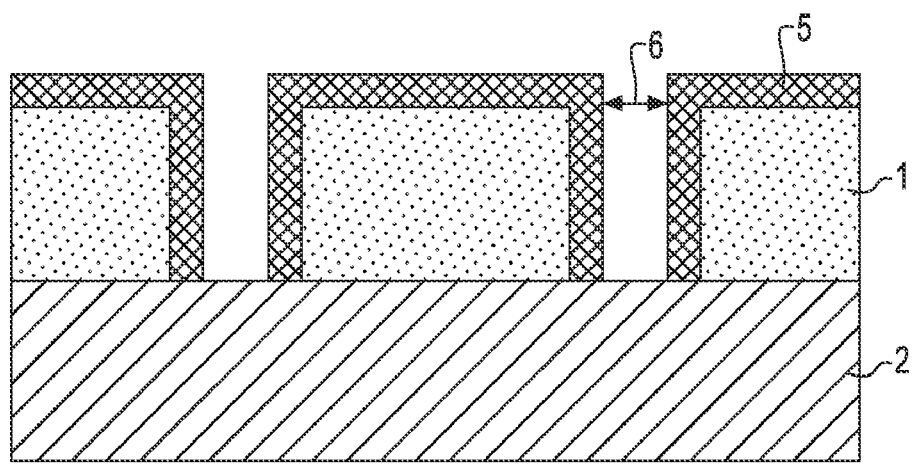

FIGS. 1A-1C included in this application depict an exemplary process described in the instant application. Referring to FIG. 1A, a first patterned film (1) disposed on a substrate (2) possesses a first critical dimension, exemplified as (3), a space width between features of the first patterned film. The first patterned film is a photoresist film that contains a thermal base generator. The first patterned film is then heat-activated to release a base, followed by deposition of a crosslinkable film (4) to produce the structure designated in FIG. 1B. The structure shown in FIG. 1B is then developed to produce the structure shown in FIG. 1C. In the structure shown in FIG. 1C, a crosslinked portion (5) of the crosslinkable film remains adhered onto the surface of the first patterned film, thereby resulting in a reduced critical dimension (6), also referred to herein as the second critical dimension.

Examples have been set forth below for the purpose of illustration and to describe certain specific embodiments of the invention. However, the scope of this invention is not to be in any way limited by the examples set forth herein.

EXAMPLE

A tetrapolymer comprising 10 mole % McpMA (Methyl-cyclopentyl Methacrylate), 40 mole % MAdMA (2-Methyl-2-adamantyl Methacrylate), 15 mole % GMA (Glycidyl methacrylate) and 35 mole % NLM (5-methacryloyloxy-2,6-norbornanecarbo-γ-lactone) was dissolved in PGMEA with 4 wt % TPSN (triphenyl sulfonium nonaflate), 0.28 wt % of ANC (Anisoin-N-cyclohexylcarbamate), 1.4 wt % of DFC and 1.2 wt % of GBL (γ-Butyrolactone) (all wt. % are relative to total polymer weight) to make a solution having 4 wt % of solid content. The resulting solution was filtered through a 0.2 micron (0.2 μm) filter. The resist was spin-coated onto a 12-inch silicon wafer which had a 42 nm thickness coating of Rohm and Haas AR40. The resist was post-apply baked (PAB) at about 110° C. for about 60 seconds and exposed to 193 nm wavelength light on an ASML stepper (0.85 NA, 0.6 s illumination). The wafer was then post-exposure baked (PEB) at about 110° C. for about 60 seconds. The film was developed using a single puddle develop process for about 30 seconds with 0.263 N TMAH (tetramethylammonium hydroxide) developer (Moses Lake's AD-10). At the dose of 28 millijoules/centimeter$^2$ (mj/cm$^2$), 181 nm contact holes were resolved. The wafer was then baked at 190° C. for 90 seconds. Next, a MSQ polysiloxane (methyl silsesquioxane) was spin-coated on the above-produced patterned wafer, followed by baking at 130° C. for about 60 seconds. The film was then developed using a single puddle development process for about 30 seconds using AD-10 developer. By the foregoing process, the original 181 nm contact holes were shrunk to 166 nm.

While there have been shown and described what are at present considered the preferred embodiments of the invention, those skilled in the art may make various changes and modifications which remain within the scope of the invention defined by the appended claims.

What is claimed is:
1. A method for reducing a photoresist critical dimension, the method comprising:
  depositing a photoresist film on a substrate, said photoresist film comprising a terpolymer or tetrapolymer, photoreactive component, and thermal base generator that releases a base at or above an activating temperature, wherein said terpolymer or tetrapolymer is comprised of monomers selected from the group consisting of

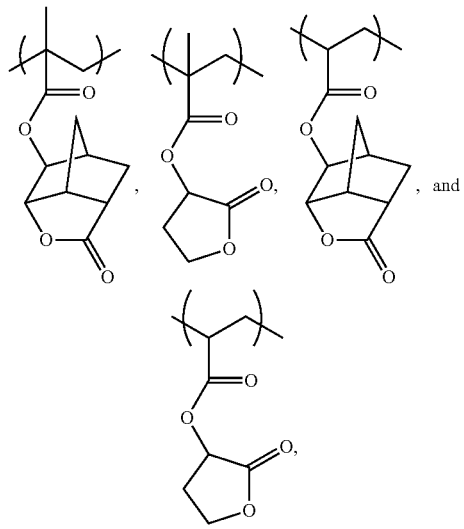

and said terpolymer or tetrapolymer is also comprised of monomers having at least one acid labile moiety that is a tertiary ester moiety;
  patterning said photoresist film to form a first patterned film possessing a first critical dimension;
  depositing a crosslinkable film over said first patterned film, wherein said crosslinkable film has the characteristic of undergoing a crosslinking reaction in the presence of said base;
  heat-activating said first patterned film, either before depositing said crosslinkable film or after depositing said crosslinkable film on said first patterned film, at or above said activating temperature, wherein release of said base from said first patterned film causes crosslinkable film in contact with and in proximity to said first patterned film to undergo a crosslinking reaction to form a crosslinked layer on said first patterned film; and developing said crosslinkable film to remove non-crosslinked soluble portions therein to form a second patterned film in which said crosslinked layer coats and preserves contours of said first patterned film, wherein said second patterned film possesses a critical dimension that is smaller than said first critical dimension.

2. The method of claim 1, wherein said terpolymer or tetrapolymer further comprises hydrophilic monomer units having a moiety selected from the group consisting of hydroxyalkyl groups and carboxylic acid groups.

3. The method of claim 2, wherein said terpolymer or tetrapolymer further comprises monomer units having a moiety selected from the group consisting of sulfonamides, fluorinated sulfonamides, fluoroalcohols, dicarboxyimides, N-hydroxy dicarboxyimides, phenol, naphthol, amino and imino groups.

4. The method of claim 1, wherein said thermal base generator comprises at least one carbamate moiety having a structure within the following generic structure:

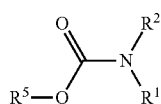

(1)

wherein $R^1$ and $R^2$ are independently selected from hydrogen atom and hydrocarbon groups, wherein said $R^1$ and $R^2$ are optionally interconnected to form a ring; and $R^5$ is a hydrocarbon group; wherein said hydrocarbon groups are, independently, saturated or unsaturated, linear or branched, cyclic or acyclic, and optionally, includes one or more heteroatoms selected from O, N, S, and halogen atoms.

5. The method of claim 4, wherein $R^5$ is a fused polycyclic hydrocarbon group.

6. The method of claim 5, wherein said thermal base generator is a compound having a structure within the following generic structure:

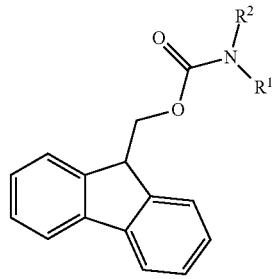

(2)

wherein $R^1$ and $R^2$ are as defined in claim 4.

7. The method of claim 4, wherein $R^5$ is a sulfonyl-containing hydrocarbon group.

8. The method of claim 7, wherein said thermal base generator is a compound having a structure within the following generic structure:

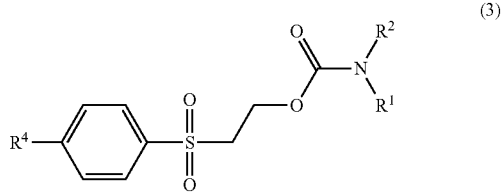

(3)

wherein $R^1$ and $R^2$ are as defined in claim 8, and $R^4$ is a hydrogen atom or hydrocarbon group, wherein said hydrocarbon group is saturated or unsaturated, linear or branched, cyclic or acyclic, and optionally, includes one or more heteroatoms selected from O, N, S, and halogen atoms.

9. The method of claim 4, wherein $R^5$ is a nitro-containing hydrocarbon group.

10. The method of claim 9, wherein said thermal base generator is a compound having a structure within the following generic structure:

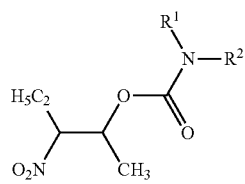

(4)

wherein $R^1$ and $R^2$ are as defined in claim 4.

11. The method of claim 4, wherein said thermal base generator is a dimeric compound having a structure within the following generic structure:

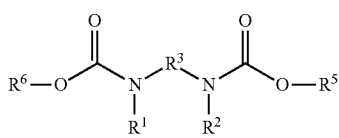

(5)

wherein $R^1$ and $R^2$ are independently selected from hydrogen atom and hydrocarbon groups, and $R^3$ is a hydrocarbon linker, wherein two or three of said $R^1$, $R^2$, and $R^3$ are optionally interconnected; $R^5$ and $R^6$ are, independently, hydrocarbon groups; wherein said hydrocarbon groups and linkers are, independently, saturated or unsaturated, linear or branched, cyclic or acyclic, and optionally, includes one or more heteroatoms selected from O, N, S, and halogen atoms.

12. The method of claim 1, wherein said activating temperature is at or above 140° C.

13. The method of claim 1, wherein said crosslinkable film is comprised of a polysiloxane composition.

14. The method of claim 13, wherein said polysiloxane composition comprises a silsesquioxane moiety.

15. The method of claim 1, wherein said second critical dimension is at least 5% smaller than said first critical dimension.

16. The method of claim 1, wherein said photoreactive component is an acid generating compound.

* * * * *